(12) United States Patent
Yoon et al.

(10) Patent No.: US 11,005,437 B2
(45) Date of Patent: May 11, 2021

(54) SPATIAL POWER-COMBINING DEVICES WITH THIN FILM RESISTORS

(71) Applicant: Qorvo US, Inc., Greensboro, NC (US)

(72) Inventors: Soack Dae Yoon, Torrance, CA (US); Ankush Mohan, Thousand Oaks, CA (US); Dan Denninghoff, Thousand Oaks, CA (US)

(73) Assignee: Qorvo US, Inc., Greensboro, NC (US)

( * ) Notice: Subject to any disclaimer, the term of this patent is extended or adjusted under 35 U.S.C. 154(b) by 13 days.

(21) Appl. No.: 16/284,214

(22) Filed: Feb. 25, 2019

(65) Prior Publication Data

US 2020/0274506 A1    Aug. 27, 2020

(51) Int. Cl.
| | |
|---|---|
| H03F 3/60 | (2006.01) |
| H03F 3/68 | (2006.01) |
| H03F 3/21 | (2006.01) |
| H01L 29/786 | (2006.01) |
| H01Q 3/42 | (2006.01) |
| H01Q 3/22 | (2006.01) |
| H03F 3/193 | (2006.01) |

(52) U.S. Cl.
CPC ........... *H03F 3/602* (2013.01); *H01L 29/786* (2013.01); *H01Q 3/22* (2013.01); *H01Q 3/42* (2013.01); *H03F 3/193* (2013.01); *H03F 3/21* (2013.01); *H03F 3/68* (2013.01)

(58) Field of Classification Search
CPC . H03F 3/602; H03F 3/68; H03F 3/193; H03F 3/21; H01Q 3/42; H01Q 3/22; H01L 29/786
USPC ....................................................... 333/127
See application file for complete search history.

(56) References Cited

U.S. PATENT DOCUMENTS

| | | | |
|---|---|---|---|
| 3,023,382 | A | 2/1962 | Borghetti |
| 4,234,854 | A | 11/1980 | Schellenberg et al. |
| 4,424,496 | A | 1/1984 | Nichols et al. |
| 5,036,335 | A | 7/1991 | Jairam |

(Continued)

FOREIGN PATENT DOCUMENTS

WO     2017214357 A2    12/2017

OTHER PUBLICATIONS

Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.

(Continued)

*Primary Examiner* — Robert J Pascal
*Assistant Examiner* — Kimberly E Glenn
(74) *Attorney, Agent, or Firm* — Withrow & Terranova, P.L.L.C.

(57) ABSTRACT

Spatial power-combining devices and, more particularly, spatial power-combining devices with improved isolation are disclosed. Spatial power-combining devices are disclosed that include a thin film resistor that is configured to provide improved signal isolation. The thin film resistor may be arranged within one or more amplifier assemblies of the spatial power-combining device to reduce signal leakage between the amplifier assemblies. The thin film resistor may be formed on a carrier substrate or the thin film resistor may supported by a surface of an amplifier assembly without a carrier substrate. Spatial power-combining devices are disclosed that include a radial arrangement of amplifier assemblies, and each amplifier assembly includes an antenna structure and a thin film resistor.

23 Claims, 9 Drawing Sheets

(56) References Cited

U.S. PATENT DOCUMENTS

| | | |
|---|---|---|
| 5,162,803 A | 11/1992 | Chen |
| 5,214,394 A | 5/1993 | Wong |
| 5,256,988 A | 10/1993 | Izadian |
| 5,736,908 A | 4/1998 | Alexanian et al. |
| 5,920,240 A | 7/1999 | Alexanian et al. |
| 6,028,483 A | 2/2000 | Shealy et al. |
| 6,037,840 A | 3/2000 | Myer |
| 6,181,221 B1 | 1/2001 | Kich et al. |
| 6,828,875 B2 | 12/2004 | Channabasappa et al. |
| 7,110,165 B2 | 9/2006 | Martin et al. |
| 7,215,220 B1 | 5/2007 | Jia |
| 7,466,203 B2 | 12/2008 | Rector |
| 8,698,577 B2 | 4/2014 | Sherrer et al. |
| 8,928,429 B2 | 1/2015 | Song et al. |
| 9,019,036 B2 | 4/2015 | Kolias et al. |
| 9,054,427 B2 | 6/2015 | Guy et al. |
| 9,065,163 B1 | 6/2015 | Wu et al. |
| 9,276,304 B2 | 3/2016 | Behan et al. |
| 9,287,605 B2 | 3/2016 | Daughenbaugh, Jr. et al. |
| 9,293,801 B2 | 3/2016 | Courtney et al. |
| 9,325,074 B2 | 4/2016 | Chandler |
| 9,917,343 B2 | 3/2018 | Chieh et al. |
| 9,954,706 B1 | 4/2018 | Harris et al. |
| 10,003,118 B2 | 6/2018 | Kitt |
| 10,009,067 B2 | 6/2018 | Birk et al. |
| 10,164,667 B1 | 12/2018 | Kitt |
| 2006/0202777 A1 | 9/2006 | Deckman et al. |
| 2007/0229186 A1 | 10/2007 | Hacker et al. |
| 2007/0279146 A1 | 12/2007 | Rector |
| 2010/0065256 A1 | 3/2010 | Wilcoxon et al. |
| 2011/0300230 A1 | 12/2011 | Peterson et al. |
| 2014/0145794 A1 | 5/2014 | Courtney et al. |
| 2014/0145795 A1 | 5/2014 | Behan et al. |
| 2014/0167880 A1 | 6/2014 | Daughenbaugh, Jr. et al. |
| 2015/0270817 A1 | 9/2015 | Campbell |
| 2017/0149113 A1 | 5/2017 | Theveneau et al. |
| 2017/0179598 A1 | 6/2017 | Kitt |
| 2018/0294539 A1 | 10/2018 | Kitt |
| 2019/0007007 A1 | 1/2019 | Kitt |
| 2019/0067778 A1 | 2/2019 | Mohan |
| 2019/0067781 A1 | 2/2019 | Mohan et al. |
| 2019/0067782 A1 | 2/2019 | Mohan et al. |
| 2019/0067783 A1 | 2/2019 | Mohan et al. |
| 2019/0067836 A1 | 2/2019 | Mohan |
| 2019/0068123 A1 | 2/2019 | Mohan et al. |
| 2019/0068140 A1 | 2/2019 | Mohan et al. |
| 2019/0068141 A1 | 2/2019 | Yoon et al. |
| 2019/0140356 A1 | 5/2019 | Mohan |

OTHER PUBLICATIONS

Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.

Courtney, Patrick G. et al., "120 W Ka Band Power Amplifier Utilizing GaN MMICs and Coaxial Waveguide Spatial Power Combining," White Paper, May 2016, Qorvo, pp. 1-8.

Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.

Leggieri, Alberto et al., "The Squarax Spatial Power Combiner," Progress in Electromagnetics Research C, vol. 45, Oct. 2013, EMW Publishing, pp. 43-55.

Ortiz, Sean C., "High Power Spatial Combiners: Tile and Tray Approaches," Dissertation, North Carolina State University, Electrical Engineering, Nov. 2001, 194 pages.

Notice of Allowance for U.S. Appl. No. 15/290,749, dated Feb. 16, 2018, 9 pages.

Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.

Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.

Fathy, A., et al., "A Simplified Approach for Radial Power Combiners," IEEE Transactions on Microwave Theory and Techniques, vol. 54, No. 1, Jan. 2006, pp. 247-255.

Gharehkand, F., "Design of a 16 Way Radial Microwave Power Divider/Combiner with Rectangular Waveguide Output and Coaxial Inputs," International Journal of Electronics and Communications (AEÜ), vol. 68, 2014, pp. 422-428.

Tribak, A., et al., "Ultra-Broadband High Efficiency Mode Converter," Progress in Electromagnetics Research C, vol. 36, 2013, pp. 145-158.

Montgomery, R., et al., "Solid-State PAs Bathe TWTAs for ECM Systems," Microwave Journal, Jun. 2017 Supplement, Jun. 14, 2017, 3 pages.

Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.

Non-Final Office Action for U.S. Appl. No. 15/637,472, dated Aug. 10, 2018, 8 pages.

Notice of Allowance for U.S. Appl. No. 15/927,565, dated Aug. 8, 2018, 8 pages.

Author Unknown, "Interpack 2005: An assessment for PMMI members," 2005, PMMI, 32 pages.

Caturla, F., et al., "Electroless Plating of Graphite with Copper and Nickel," Journal of the Electrochemical Soceity, vol. 142, Issue 12, Dec. 1995, The Electrochemical Society, Inc., pp. 4084-4090.

Fitzhugh, William, et al., "Modulation of Ionic Current Limitations by Doping Graphite Anodes," Journal of Electrochemical Society, vol. 165, Issue 10, Jul. 2018, The Electrochemical Society, 6 pages.

Larkins, Grover, et al., "Evidence of Superconductivity in Doped Graphite and Graphene," Superconductor Science and Technology, vol. 29, Issue 1, Dec. 2015, IOP Publishing Ltd, 18 pages.

Glenis, S., et al., "Sulfur doped graphite prepared via arc discharge of carbon rods in the presence of thiopenes," Journal of Applied Physics, vol. 86, Issue 8, Oct. 1999, American Institute of Physics, pp. 4464-4466.

Scheike, T., et al., "Can doping graphite trigger room temperature superconductivity: Evidence for granular high-temperature superconductivity in water-treated graphite powder," Advanced Materials, vol. 24, Issue 43, Sep. 2012, 19 pages.

Smalc, Martin, et al., "Thermal Performance of Natural Graphite Heat Spreaders," Proceedings of IPACK2005, Jul. 17-22, San Francisco, California, American Society of Mechanical Engineers, 11 pages.

Notice of Allowance for U.S. Appl. No. 15/637,472, dated Mar. 12, 2019, 7 pages.

Non-Final Office Action for U.S. Appl. No. 15/846,840, dated Mar. 21, 2019, 4 pages.

Notice of Allowance for U.S. Appl. No. 15/845,225, dated Jan. 10, 2019, 7 pages.

Notice of Allowance for U.S. Appl. No. 16/166,548, dated Nov. 29, 2018, 8 pages.

Non-Final Office Action for U.S. Appl. No. 15/933,783, dated May 1, 2019, 8 pages.

Non-Final Office Action for U.S. Appl. No. 16/042,351, dated Jul. 5, 2019, 5 pages.

Notice of Allowance for U.S. Appl. No. 15/846,840, dated Jul. 5, 2019, 7 pages.

Non-Final Office Action for U.S. Appl. No. 15/981,535, dated Jul. 8, 2019, 5 pages.

U.S. Appl. No. 16/039,435, filed Jul. 19, 2018.
U.S. Appl. No. 16/214,234, filed Dec. 10, 2018.
U.S. Appl. No. 16/288,735, filed Feb. 28, 2019.
U.S. Appl. No. 16/288,761, filed Feb. 28, 2019.
U.S. Appl. No. 16/191,541, filed Nov. 15, 2018.

Non-Final Office Action for U.S. Appl. No. 15/933,821, dated Jul. 11, 2019, 7 pages.

Non-Final Office Action for U.S. Appl. No. 15/981,516, dated Jul. 17, 2019, 5 pages.

(56) References Cited

OTHER PUBLICATIONS

Notice of Allowance for U.S. Appl. No. 16/005,794, dated Jan. 9, 2020, 7 pages.
Non-Final Office Action for U.S. Appl. No. 16/032,252, dated Dec. 27, 2019, 5 pages.
Notice of Allowance for U.S. Appl. No. 16/008,586, dated Feb. 4, 2020, 8 pages.
Corrected Notice of Allowance and Applicant-Initiated Interview Summary for U.S. Appl. No. 15/846,840, dated Dec. 31, 2019, 6 pages.
Notice of Allowance for U.S. Appl. No. 15/981,535, dated Dec. 31, 2019, 7 pages.
Notice of Allowance for U.S. Appl. No. 15/933,821, dated Jan. 15, 2020, 7 pages.
Non-Final Office Action for U.S. Appl. No. 16/039,435, dated Jan. 7, 2020, 5 pages.
Notice of Allowance for U.S. Appl. No. 15/981,516, dated Jan. 15, 2020, 7 pages.
Espera Jr., A.H. et al., "3D-printing and advanced manufacturing for electronics," Progress in Additive Manufacturing, Feb. 4, 2019, Springer, 24 pages.
Glasschroeder, J. et al., "Powder-bed-based 3D-printing of function integrated parts," Rapid Prototyping Journal, vol. 21, Issue 2, Emerald Group Publishing Limited, pp. 207-215.
Leigh, S.J. et al., "A Simple, Low-Cost Conductive Composite Material for 3D Printing of Electronic Sensors," PLoS ONE, vol. 7, Issue 11, Nov. 2012, 6 pages.
Sames, W.J. et al., "The Metallurgy and Processing Science of Metal Additive Manufacturing," 2016, available at https://www.osti.gov/servlets/purl/1267051, 76 pages.
Corrected Notice of Allowability and Examiner-Initiated Interview Summary for U.S. Appl. No. 16/005,794, dated May 26, 2020, 6 pages.
Notice of Allowance for U.S. Appl. No. 16/032,252, dated Jun. 1, 2020, 7 pages.
Notice of Allowance for U.S. Appl. No. 16/039,435, dated Jun. 17, 2020, 8 pages.
Notice of Allowance for U.S. Appl. No. 16/214,234, dated May 15, 2020, 8 pages.
Non-Final Office Action for U.S. Appl. No. 16/288,735, dated May 26, 2020, 9 pages.
Final Office Action for U.S. Appl. No. 16/191,541, dated Mar. 31, 2020, 8 pages.
Advisory Action, Examiner-Initiated Interview Summary, and AFCP 2.0 Decision for U.S. Appl. No. 16/191,541, dated May 21, 2020, 5 pages.
Non-Final Office Action for U.S. Appl. No. 16/005,794, dated Oct. 7, 2019, 11 pages.
Notice of Allowance for U.S. Appl. No. 16/042,351, dated Nov. 18, 2019, 7 pages.
Non-Final Office Action for U.S. Appl. No. 16/008,586, dated Oct. 24, 2019, 10 pages.
Non-Final Office Action for U.S. Appl. No. 16/191,541, dated Dec. 9, 2019, 7 pages.
Corrected Notice of Allowance and Examiner-Initiated Interview Summary for U.S. Appl. No. 15/846,840, dated Dec. 12, 2019, 6 pages.
Notice of Allowance for U.S. Appl. No. 16/191,541, dated Jul. 9, 2020, 7 pages.
Notice of Allowance for U.S. Appl. No. 16/288,735, dated Oct. 29, 2020, 7 pages.
Non-Final Office Action for U.S. Appl. No. 16/288,761, dated Apr. 1, 2021, 8 pages.

SPATIAL POWER-COMBINING DEVICES WITH THIN FILM RESISTORS

FIELD OF THE DISCLOSURE

The disclosure relates generally to spatial power-combining devices and, more particularly, to spatial power-combining devices with thin film resistors.

BACKGROUND

Spatial power-combining devices, such as a Qorvo® Spatium® spatial power-combining device, are used for broadband radio frequency power amplification in commercial and defense communications, radar, electronic warfare, satellite, and various other communication systems. Spatial power-combining techniques are implemented by combining broadband signals from a number of amplifiers to provide output powers with high efficiencies and operating frequencies. One example of a spatial power-combining device utilizes a plurality of solid-state amplifier assemblies that form a coaxial waveguide to amplify an electromagnetic signal. Each amplifier assembly may include an input antenna structure, an amplifier, and an output antenna structure. When the amplifier assemblies are combined to form the coaxial waveguide, the input antenna structures may form an input antipodal antenna array, and the output antenna structures may form an output antipodal antenna array.

In operation, an electromagnetic signal is passed through an input port to an input coaxial waveguide section of the spatial power-combining device. The input coaxial waveguide section distributes the electromagnetic signal to be split across the input antipodal antenna array. The amplifiers receive the split signals and in turn transmit amplified split signals across the output antipodal antenna array. The output antipodal antenna array and an output coaxial waveguide section combine the amplified split signals to form an amplified electromagnetic signal that is passed to an output port of the spatial power-combining device.

Antenna structures for spatial power-combining devices typically include an antenna signal conductor and an antenna ground conductor deposited on opposite sides of a substrate, such as a printed circuit board. The size of the antenna structures are related to an operating frequency of the spatial power-combining device. For example, the size of the input antenna structure is related to the frequency of energy that can be efficiently received, and the size of the output antenna structure is related to the frequency of energy that can be efficiently transmitted. Overall sizes of spatial power-combining devices typically scale larger or smaller depending on desired operating frequency ranges. In most applications, antenna structures can arranged in close proximity to one another on adjacent amplifier assemblies.

The art continues to seek improved spatial power-combining devices having improved performance characteristics while being capable of overcoming challenges associated with conventional devices.

SUMMARY

Aspects disclosed herein relate to spatial power-combining devices and, more particularly, to spatial power-combining devices with improved isolation. According to embodiments disclosed herein, a spatial power-combining device includes a thin film resistor that is configured to provide improved signal isolation. The thin film resistor may be arranged within one or more amplifier assemblies of the spatial power-combining device to reduce signal leakage between the amplifier assemblies. In certain embodiments, the thin film resistor may be formed on a carrier substrate, and in other embodiments, the thin film resistor may be supported by a surface of an amplifier assembly without a carrier substrate. In certain embodiments, spatial power-combining devices are disclosed that include a radial arrangement of amplifier assemblies, and each amplifier assembly includes an antenna structure and a thin film resistor.

In one aspect, a spatial power-combining device comprises a plurality of amplifier assemblies, wherein each amplifier assembly of the plurality of amplifier assemblies comprises: a body structure; an amplifier arranged on the body structure; an output antenna structure arranged on the body structure and configured to receive an amplified signal from the amplifier; and a thin film resistor on at least one surface of the body structure that is configured to provide isolation between the output antenna structure of each amplifier assembly of the plurality of amplifier assemblies. The thin film resistor may comprise nickel chromium, tantalum nitride, or silicon chromium. In certain embodiments, the thin film resistor comprises a thickness in a range from about 0.01 micron (μm) to about 10 μm, or a thickness in a range from about 0.5 μm to about 1.5 μm. In certain embodiments, the thin film resistor is configured on a carrier substrate. The carrier substrate may comprise a ceramic substrate, alumina, copper foil, silicon, or gallium arsenide. In certain embodiments, the thin film resistor and the carrier substrate form an alignment feature configured for placement within a particular amplifier assembly of the plurality of amplifier assemblies. In certain embodiments, the alignment feature is configured to receive a board of the output antenna structure such that the thin film resistor is arranged on opposing faces of the board. In certain embodiments, the at least one surface is a first interior surface of the body structure, the first interior surface and a second interior surface form an opening therebetween. The second interior surface may be arranged closer to a center axis of the spatial power-combining device. In certain embodiments, the thin film resistor is on both of the first interior surface of a first amplifier assembly of the plurality of amplifier assemblies and the first interior surface of a second amplifier assembly of the plurality of amplifier assemblies. The amplifier may comprise a monolithic microwave integrated circuit (MMIC) amplifier.

In another aspect, a spatial power-combining device comprises a plurality of amplifier assemblies, wherein each amplifier assembly of the plurality of amplifier assemblies comprises: an amplifier arranged on a body structure, the body structure comprising a first interior surface and a second interior surface that form an opening therebetween; an antenna structure on the body structure, the antenna structure arranged across the opening; and a thin film resistor on the first interior surface. The thin film resistor may comprise nickel chromium, tantalum nitride, or silicon chromium. In certain embodiments, the thin film resistor comprises a thickness in a range from about 0.01 μm to about 10 μm, or a thickness in a range from about 0.5 μm to about 1.5 μm. In certain embodiments, the thin film resistor is directly on the first interior surface. In other embodiments, the thin film resistor is on a carrier substrate that is arranged on the first interior surface. The carrier substrate may comprise alumina, copper foil, silicon, or gallium arsenide. In certain embodiments, the antenna structure is electrically grounded to the body structure. The antenna structure may be an output antenna structure that is configured to receive an amplified signal from the amplifier. In certain embodiments, the amplifier comprises a monolithic microwave integrated circuit (MMIC) amplifier.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
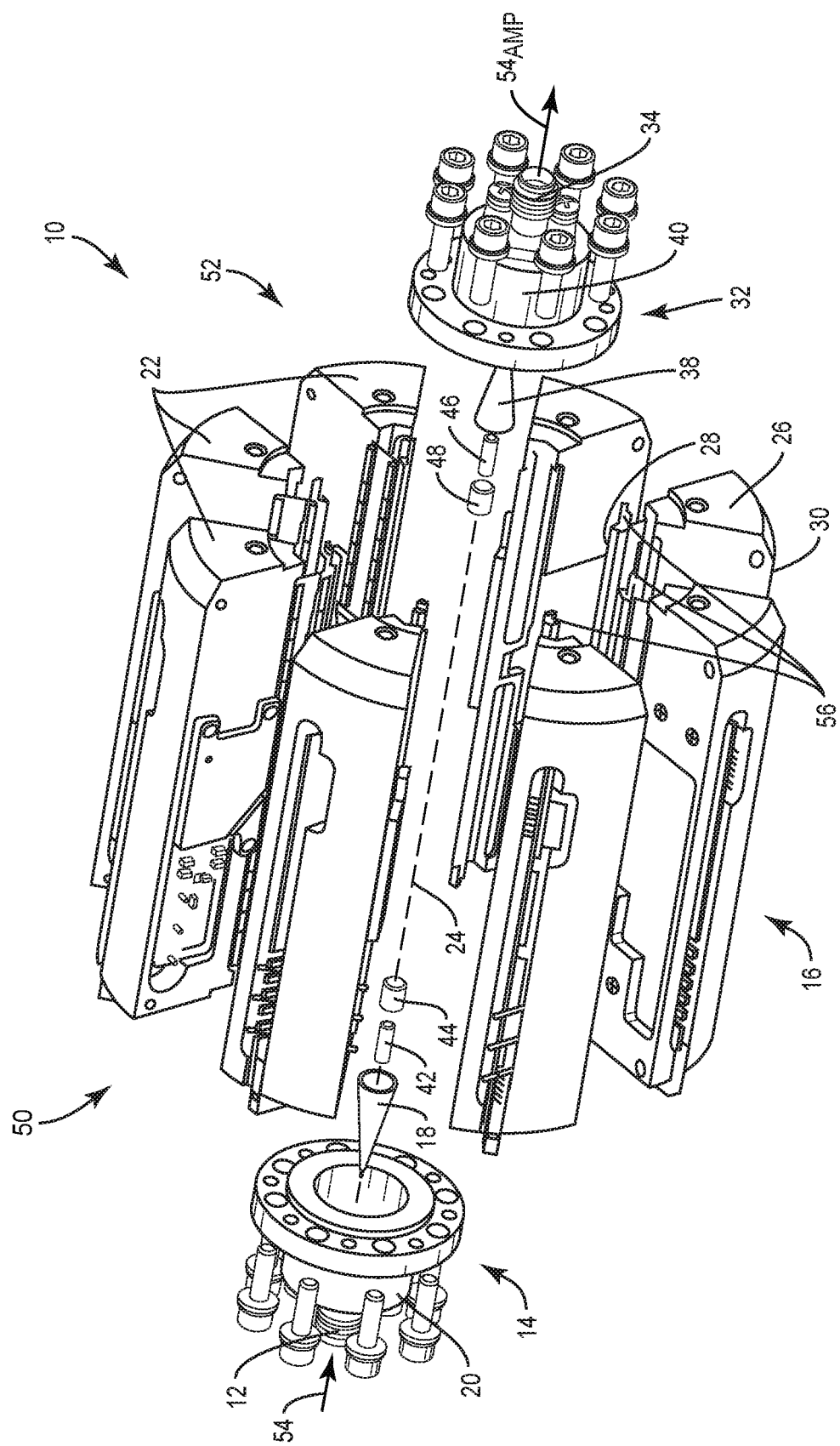
FIG. 1 is a perspective exploded view of a representative spatial power-combining device according to some embodiments.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein relate to spatial power-combining devices and, more particularly, to spatial power-combining devices with improved isolation. According to embodiments disclosed herein, a spatial power-combining device includes a thin film resistor that is configured to provide improved signal isolation. The thin film resistor may be arranged within one or more amplifier assemblies of the spatial power-combining device to reduce signal leakage between the amplifier assemblies. In certain embodiments, the thin film resistor may be formed on a carrier substrate, and in other embodiments, the thin film resistor may be supported by a surface of an amplifier assembly without a carrier substrate. In certain embodiments, spatial power-combining devices are disclosed that include a radial arrangement of amplifier assemblies, and each amplifier assembly includes an antenna structure and a thin film resistor.

The embodiments are particularly adapted to spatial power-combining devices that operate at microwave frequencies, such as, by way of non-limiting example, energy between about 300 megahertz (MHz) (100 centimeters (cm) wavelength) and 300 gigahertz (GHz) (0.1 cm wavelength). Additionally, embodiments may comprise operating frequency ranges that extend above microwave frequencies. In some embodiments, by way of non-limiting examples, the operating frequency range includes an operating bandwidth of 4 GHz to 40 GHz, or 2 GHz to 18 GHz, or 2 GHz to 20 GHz, among others.

A spatial power-combining device generally includes a plurality of amplifier assemblies, and each amplifier assembly is an individual signal path that includes an amplifier connected to an input antenna structure and an output antenna structure. An input coaxial waveguide is configured to provide a signal concurrently to each input antenna structure, and an output coaxial waveguide is configured to concurrently combine amplified signals from each output antenna structure. The plurality of amplifier assemblies are arranged coaxially about a center axis. Accordingly, the spatial power-combining device is configured to split, amplify, and combine an electromagnetic signal.

FIG. 1 is a perspective exploded view of a representative spatial power-combining device 10 according to some embodiments. The spatial power-combining device 10 comprises an input port 12 and an input coaxial waveguide section 14. The input coaxial waveguide section 14 provides a broadband transition from the input port 12 to a center waveguide section 16. Electrically, the input coaxial waveguide section 14 provides broadband impedance matching from an impedance $Z_{p1}$ of the input port 12 to an impedance $Z_c$ of the center waveguide section 16. The input coaxial waveguide section 14 comprises an input inner conductor 18 and an input outer conductor 20. Outer surfaces of the input inner conductor 18 and inner surfaces of the input outer conductor 20 have gradually changed profiles configured to minimize the impedance mismatch from the input port 12 to the center waveguide section 16.

The center waveguide section 16 comprises a plurality of amplifier assemblies 22 arranged radially around a center axis 24 of the spatial power-combining device 10. Each amplifier assembly 22 comprises a body structure 26 having a predetermined wedge-shaped cross-section, an inner surface 28, and an arcuate outer surface 30. When the amplifier assemblies 22 are assembled radially about the center axis 24, they collectively form the center waveguide section 16 with a generally cylindrical shape; however, other shapes are possible, such as rectangular, oval, or other geometric shapes. The inner surface 28 and the outer surface 30 refer to how surfaces of each amplifier assembly 22 are configured when the plurality of amplifier assemblies 22 are radially arranged around the center axis 24, or a center post when included. For example, when assembled, the inner surface 28 of each amplifier assembly 22 is radially arranged around the center axis 24 and is internal to the center waveguide section 16, and the outer surface 30 of each amplifier assembly 22 collectively forms a cylindrical outer surface of the center waveguide section 16.

The spatial power-combining device 10 also comprises an output coaxial waveguide section 32 and an output port 34. The input port 12 and the output port 34 may comprise any of a field-replaceable Subminiature A (SMA) connector, a super SMA connector, a type N connector, a type K connector, a WR28 connector, other coaxial to waveguide transition connectors, or any other suitable coaxial or waveguide connectors. In embodiments where the operating frequency range includes a frequency of at least 18 GHz, the output port 34 may comprise a waveguide output port, such as a WR28 or other sized waveguide. The output coaxial waveguide section 32 provides a broadband transition from the center waveguide section 16 to the output port 34. Electrically, the output coaxial waveguide section 32 provides broadband impedance matching from the impedance $Z_c$ of the center waveguide section 16 to an impedance $Z_{p2}$ of the output port 34. The output coaxial waveguide section 32 comprises an output inner conductor 38 and an output outer conductor 40. Outer surfaces of the output inner conductor 38 and inner surfaces of the output outer conductor 40 have gradually changed profiles configured to minimize the impedance mismatch from the output port 34 to the center waveguide section 16. In some embodiments, impedance matching is configured for 50 ohms, although other designs such as 30 ohms are possible. A first screw 42 and a first nut 44 are provided for mechanically attaching the input inner conductor 18 to the plurality of amplifier assemblies 22. In a similar manner, a second screw 46 and a second nut 48 are provided for mechanically attaching the output inner conductor 38 to the plurality of amplifier assemblies 22. The plurality of amplifier assemblies 22 comprise an input end 50 and an output end 52. The input inner conductor 18 is mechanically attached to the input end 50, and the output inner conductor 38 is mechanically attached to the output end 52. Accordingly, a spatial power-combining device 10 is provided that comprises a center waveguide section 16 comprising a plurality of amplifier assemblies 22, wherein the plurality of amplifier assemblies 22 forms an input end 50 and an output end 52, an input inner conductor 18 mechanically attached to the input end 50, and an output inner conductor 38 mechanically attached to the output end 52. In some embodiments, the input inner conductor 18 may be directly attached to the input end 50 and the output inner conductor 38 may be directly attached to the output end 52. In other spatial power-combining devices, inner conductors may be mechanically attached to a separate support element, such as a center post or rod. Amplifier assemblies may be stacked circumferentially around the center post and may have inner surfaces that conform to the outer shape of the center post. Accordingly, the conventional center post is provided for mechanical support and assembly of the spatial power-combining device.

In operation, the input port 12 receives a signal 54 and the input coaxial waveguide section 14 is configured to provide the signal 54 concurrently to each of the amplifier assemblies 22 where the signal is concurrently amplified by the respective amplifier assemblies 22. The output coaxial waveguide section 32 is configured to concurrently combine the amplified signals to form an amplified output signal $54_{Amp}$, which is propagated through the output coaxial waveguide section 32 to the output port 34 for transmitting the amplified output signal $54_{Amp}$.

Figure 2:
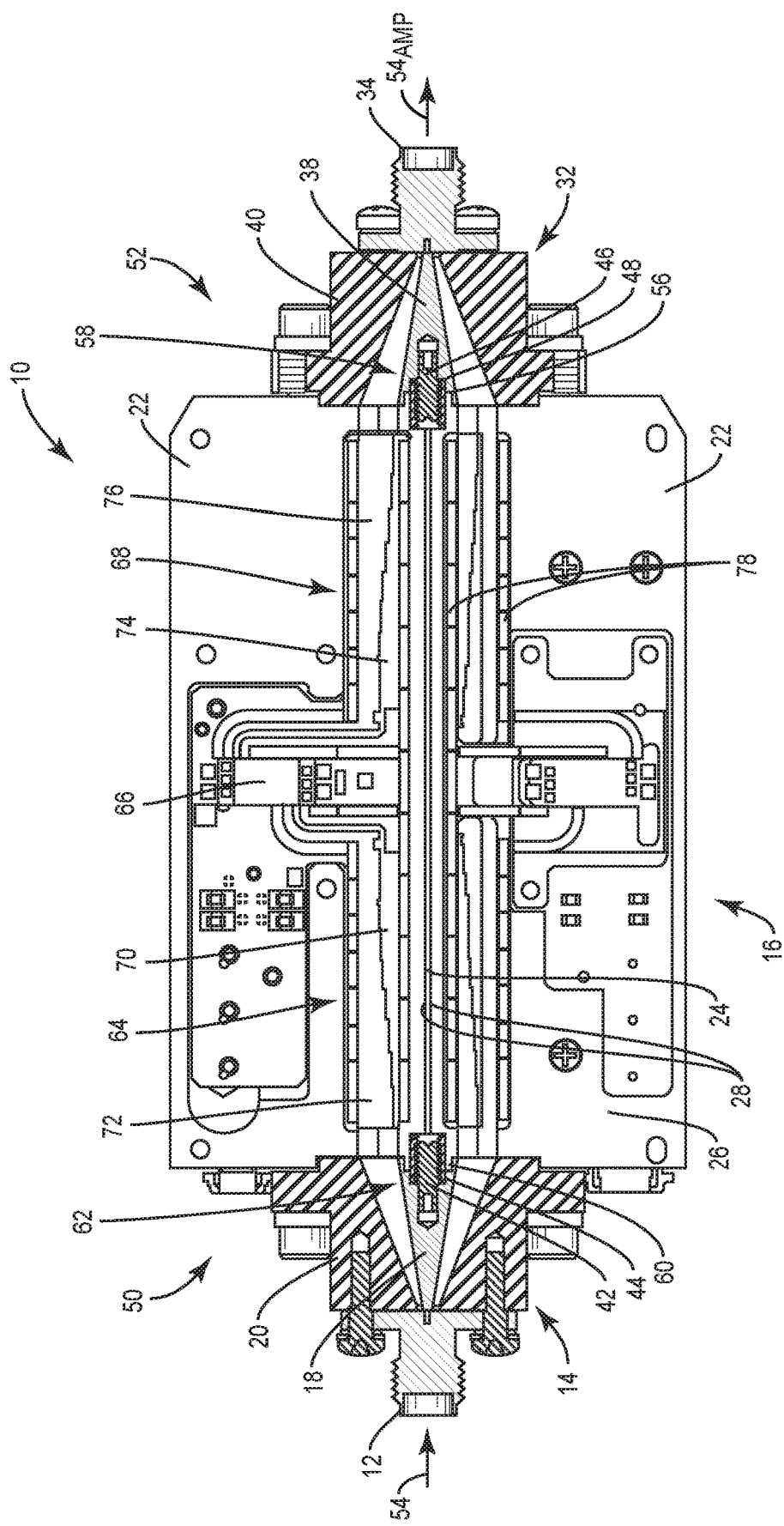
FIG. 2 is a partial and unexploded cross-sectional view of the spatial power-combining device of FIG. 1.

FIG. 2 is a partial and unexploded cross-sectional view of the spatial power-combining device 10 of FIG. 1. Several amplifier assemblies 22 are omitted to illustrate the following details. Both the input end 50 and the output end 52 of the plurality of amplifier assemblies 22 are visible within the center waveguide section 16. The input port 12 and input coaxial waveguide section 14 are located adjacent the input end 50, and the output port 34 and output coaxial waveguide section 32 are located adjacent the output end 52. The input coaxial waveguide section 14 comprises the input inner conductor 18 and the input outer conductor 20, and the output coaxial waveguide section 32 comprises the output inner conductor 38 and the output outer conductor 40. Output connector portions 56 of the plurality of amplifier assemblies 22 collectively form an output connector receptacle 58, and input connector portions 60 of the plurality of amplifier assemblies 22 collectively form an input connector receptacle 62. As shown, the input inner conductor 18 is configured to mechanically attach to the input end 50 at the input connector receptacle 62 by the first screw 42, and the output inner conductor 38 is configured to mechanically attach to the output end 52 at the output connector receptacle 58 by a second screw 46. The first nut 44 is inside the input connector receptacle 62 and is configured to receive the first screw 42, and the second nut 48 is inside the output connector receptacle 58 and is configured to receive the second screw 46. The mechanical attachment of the input inner conductor 18 and the output inner conductor 38 to the input end 50 and output end 52, respectively, allows the center axis 24 to be hollow, and thus the inner surface 28 of the body structure 26 of each amplifier assembly 22 may be separated from the center axis 24 by empty space. For example, the inner surface 28 of each amplifier assembly 22 is separated from the center axis 24 completely by empty space, with no support structure in between. In some embodiments, the inner surface 28 of each amplifier assembly 22 is spaced from the center axis 24 by a distance of no more than 50 mil, and in further embodiments the spacing may be lower. For example, the inner surface 28 of each amplifier assembly 22 may be spaced from the center axis 24 by a distance of about 10 mil. Amplifier assemblies in other spatial power-combining devices are not spaced from a center axis by a distance of 50 mil or less due to the presence of the center rod. For example, other spatial power-combining devices with center rods typically have amplifier assemblies spaced from the center axis by at least 80 mil.

Accordingly, the spacing of the amplifier assemblies can be reduced to achieve higher frequency operation and increased bandwidth. In some applications, the operating frequency range includes an operating bandwidth spread of 4 GHz to 41 GHz. For such applications, the reduced spacing may only allow for a reduced number of amplifier assemblies. In some embodiments, the plurality of amplifier assemblies comprise fewer than ten amplifier assemblies. For an operating bandwidth spread of 4 GHz to 41 GHz, some embodiments may comprise eight amplifier assemblies and may therefore be referred to as an eight-way spatial power-combining device, as represented in FIG. 1. In other embodiments with a lower operating bandwidth spread, such as 2 GHz to 20 GHz, the spacing may be greater than these ranges and more amplifier assemblies may be included.

As shown in FIG. 2, each amplifier assembly 22 comprises an input antenna structure 64, an amplifier 66, and an output antenna structure 68. In some embodiments, the amplifier 66 comprises a monolithic microwave integrated circuit (MMIC) amplifier. The MMIC may be a solid-state gallium nitride (GaN)-based MMIC. A GaN MMIC device provides high power density and bandwidth, and a spatial power-combining device may combine power from a plurality of GaN MMICs efficiently in a single step to minimize combining loss. The input antenna structure 64 comprises an input antenna pattern 70 supported on a first board 72, and the output antenna structure 68 comprises an output antenna pattern 74 supported on a second board 76. The first board 72 and second board 76 may be printed circuit boards that provide the desired form factor and mechanical support for the input antenna pattern 70 and output antenna pattern 74, respectively. It is understood that both the input antenna pattern 70 and the output antenna pattern 74 may include signal and ground portions on opposing sides of the first board 72 and second board 76, respectively. Additionally, one or more electromagnetic interference filters 78 are supported on both the first board 72 and the second board 76. The electromagnetic interference filters 78 are located around the input antenna pattern 70 and output antenna pattern 74 to help suppress modes and reduce leakage between the amplifier assemblies 22. In other embodiments, the input antenna pattern 70 and output antenna pattern 74 may comprise metal that is thick enough to be incorporated into each amplifier assembly 22 without requiring a first board 72 or second board 76 for support. In certain embodiments, the input antenna structure 64 and the output antenna structure 68 are electrically grounded with the body structure 26.

In operation, the signal 54 enters through the input port 12 and propagates through the input coaxial waveguide section 14 to the input antenna structure 64 of each amplifier assembly 22. Each input antenna structure 64 couples the signal 54 to each amplifier 66, and each output antenna structure 68 couples the amplified signal $54_{AMP}$ to the output coaxial waveguide section 32 to be propagated to the output port 34. The spatial power-combining device 10 is typically utilized for high power-combining applications, and the amplifier 66 in each of the amplifier assemblies 22 is configured for high power amplification, and may therefore generate a high amount of heat. Accordingly, the body structure 26 of each amplifier assembly 22 may typically comprise a highly thermally conductive material, such as copper (Cu), aluminum (Al), or alloys thereof that are configured to dissipate enough heat from the amplifier 66 to maintain a suitably low operating temperature. Additionally, another metal layer, such as silver (Ag), may be plated on the other materials. In addition to highly thermally conductive metals, the body structure 26 may comprise highly thermally conductive polymers and ceramics, including graphite or graphene, or other highly thermally conductive materials.

Thermally conductive metals and metal alloys are common materials for body structures due to their high thermal conductivities and various manufacturing techniques widely available for forming such body structures. When assembled closely together in a spatial power-combining device, the metal or metal alloys of body structures can reduce isolation between amplifier assemblies. In particular, the metal or metal alloy may form electrically conductive surfaces or paths between an antenna structure of one amplifier assembly and an adjacent antenna structure of an adjacent amplifier assembly. In this regard, electromagnetic signals propagating through one amplifier assembly can bleed over to adjacent amplifier assemblies, which can cause the amplifiers to experience mismatch, phase changes, and shortened operating lifetimes.

Figure 3A:
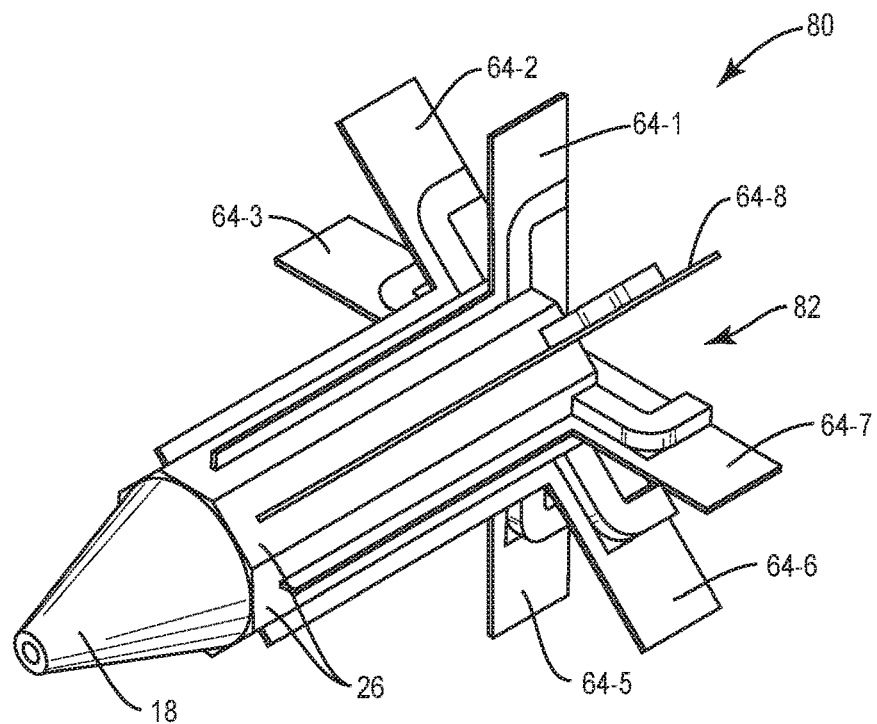
FIG. 3A is a perspective view of a model of a spatial power-combining device that includes body structures of metal between and supporting input antenna structures.
Figure 3B:
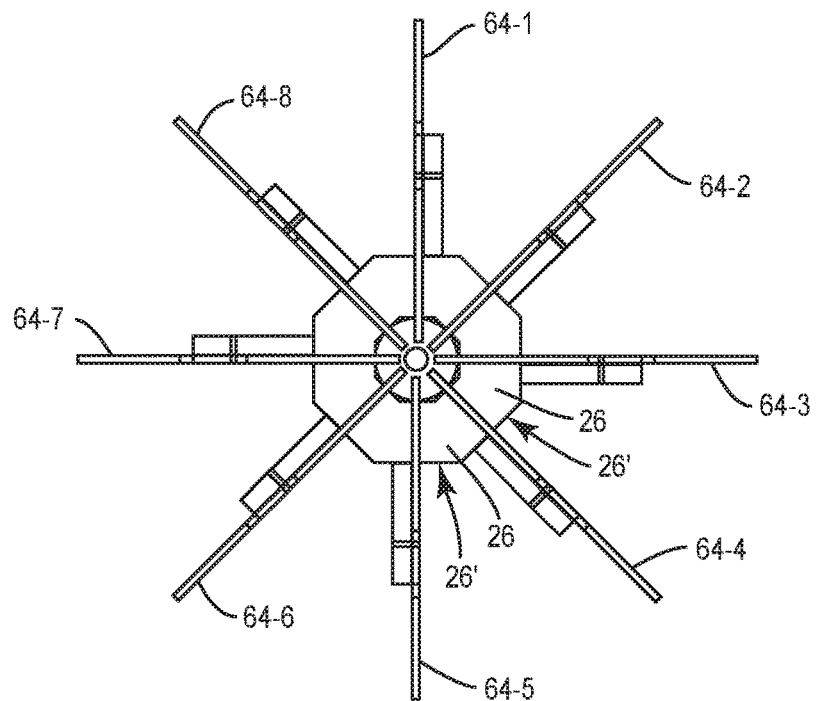
FIG. 3B is an end view of a plane of the model of FIG. 3A.

In order to demonstrate the effects of signal leakage, model simulations were performed for spatial power-combining devices having metal body structures. FIG. 3A is a perspective view of a model 80 of a spatial power-combining device that includes the body structures 26 of metal between and supporting input antenna structures 64-1 to 64-8. Each input antenna structure 64-1 to 64-8 are radially arranged to receive a signal from the input coaxial waveguide section (14 of FIG. 2). For simplicity, only the input inner conductor 18 is illustrated in FIG. 3A. Additionally, only portions of the body structures 26 and the input antenna structures 64-1 to 64-8 are illustrated. In particular, the model 80 is only shown to a plane 82 that would be close to the amplifiers (66 of FIG. 2). In this manner, the performance results of the model 80 are also applicable to the output antenna structures (68 of FIG. 2) and the output coaxial waveguide section (32 of FIG. 2). FIG. 3B is an end view of the plane 82 of FIG. 3A. As illustrated, eight input antenna structures 64-1 to 64-8 are radially arranged, and each body structure 26 forms a surface 26' between each of the input antenna structures 64-1 to 64-8. When the surfaces 26' include an electrically conductive metal, surface current during operation can thereby leak or bleed between each of the input antenna structures 64-1 to 64-8 by way of the surfaces 26'.

Figure 3C:
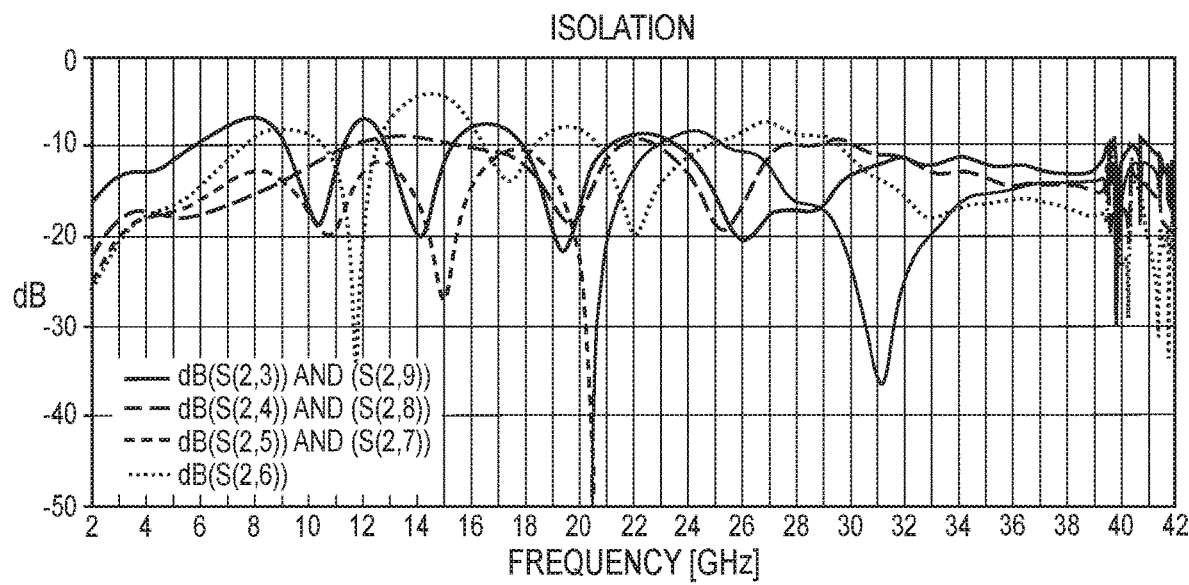
FIG. 3C is an S-parameters plot representing output isolation in decibels (dB) across a frequency range for the model of FIG. 3A.

FIG. 3C is an S-parameters plot representing output isolation in decibels (dB) across a frequency range for the model 80 of FIG. 3A. Values that are farther away from 0 dB indicate better output isolation than values that are closer to 0 dB. S(2,3) represents output isolation between the antenna structure 64-1 and the antenna structure 64-2 of FIG. 3B; S(2,4) represents output isolation between the antenna structure 64-1 and the antenna structure 64-3 of FIG. 3B; S(2,5) represents output isolation between the antenna structure 64-1 and the antenna structure 64-4 of FIG. 3B; S(2,6) represents output isolation between the antenna structure 64-1 and the antenna structure 64-5 of FIG. 3B; S(2,7) represents output isolation between the antenna structure 64-1 and the antenna structure 64-6 of FIG. 3B; S(2,8) represents output isolation between the antenna structure 64-1 and the antenna structure 64-7 of FIG. 3B; and finally S(2,9) represents output isolation between the antenna structure 64-1 and the antenna structure 64-8 of FIG. 3B. In the model, S(2,3) and S(2,9) have similar output isolation results as the antenna structure 64-1 of FIG. 3B is positioned about the same distance from the antenna structures 64-2 and 64-8 of FIG. 3B. In a similar manner, S(2,4) and S(2,8) have similar isolation results and S(2,5) and S(2,7) have similar isolation results. As illustrated, the output isolation is less than 10 dB for many points along the frequency range, which can be attributed to signal leakage as previously described.

Figure 3D:
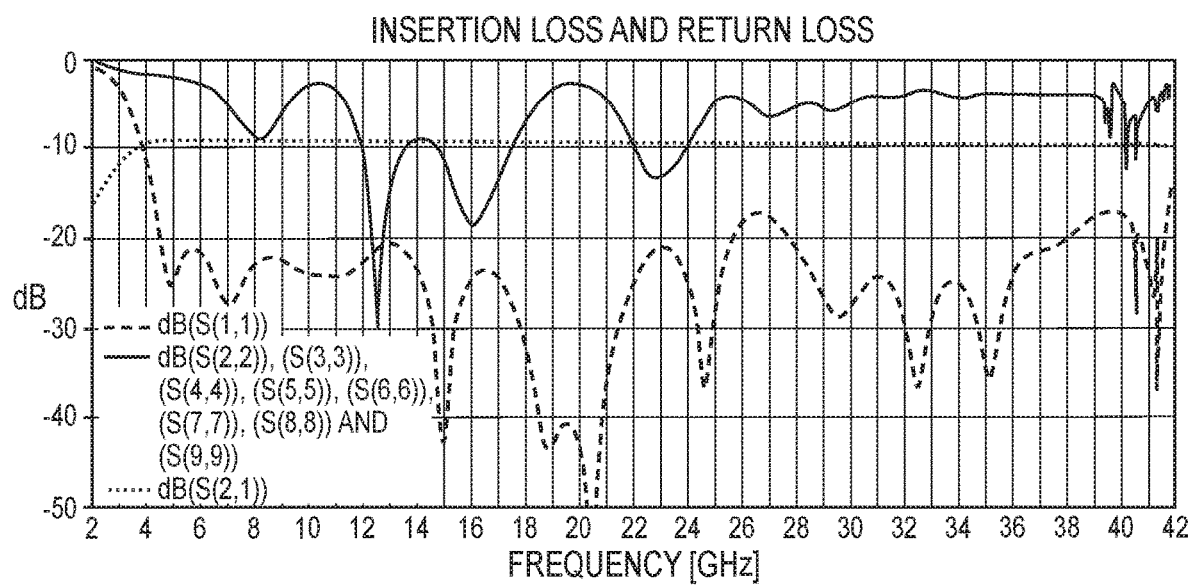
FIG. 3D is an S-parameters plot representing insertion loss and return loss in dB across the same frequency range shown in FIG. 3C for the model of FIG. 3A.

FIG. 3D is an S-parameters plot representing insertion loss and return loss in dB across the same frequency range shown in FIG. 3C for the model 80 of FIG. 3A. For return loss, values that are closer to 0 dB indicate worse return loss than values that are farther away from 0 dB. S(1,1) represents input return loss for the model 80 of FIG. 3A. As illustrated, the input return loss is greater than about 20 dB for many frequencies of the frequency range plotted, indicating acceptable input return loss. S(2,2) through S(9,9) represent output return loss for each of the respective antenna structures 64-1 to 64-8 of FIG. 3A, and as illustrated, the plot lines for S(2,2) through S(9,9) overlay one another. The output return loss, or S(2,2) to S(9,9), is less than 4 dB for many of the plotted frequencies, indicating reduced isolation. S(2,1) represents insertion loss of the model 80 of FIG. 3A and values below 10 dB are considered normal.

As illustrated in FIG. 3C and FIG. 3D, signal leakage between closely spaced antenna structures may negatively impact isolation and return loss in spatial power-combining devices. As previously described, signal leakage can be present between input antenna structures and between output antenna structures. In a fully assembled spatial power-combining device, the amplifiers may comprise MMICs that are configured to provide compensation and isolation for signal leakage between respective input antenna structures. In this regard, signal leakage that occurs between respective output antenna structures occurs downstream of the MMICs and is therefore not compensated by the MMICs. According to embodiments disclosed herein, spatial power-combining devices may include one or more thin film resistors that are configured to reduce electromagnetic signals from bleeding between closely spaced amplifier assemblies. In certain embodiments, the one or more thin film resistors may be provided on one or more surfaces of the amplifier assemblies that collectively form a center waveguide as previously described. In certain embodiments, the one or more thin film resistors may be provided between respective output antenna structures to provide improved signal isolation downstream of the amplifiers. In certain embodiments, the one or more thin film resistors may be provided between respective input antenna structures to provide improved signal isolation before signals are transferred to the amplifiers. A thin film resistor may comprise a thin resistive layer on or supported by another surface, such as a base or substrate. In certain embodiments, the thin film resistor may include a thin resistive layer of nickel chromium, nichrome alloy, tantalum nitride, silicon chrome, or sichrome alloy, among others and the substrate may include alumina or another ceramic material, silicon, or gallium arsenide, among others. In certain embodiments, the thin film resistor may be formed on or supported by a surface of an amplifier assembly without an intermediate substrate. The thin film resistor may include a thickness configured to provide a certain amount of sheet resistance that is dependent on the particular application. With different configurations of material types and thicknesses, thin film resistors may be provided that have sheet resistances in a range from about 25 ohms per square ($\Omega$/sq) to about 150 $\Omega$/sq. Spatial power-combining devices may be configured for operation at a variety of operating frequency ranges. Accordingly, the overall size of the spatial power-combining device and the thickness of the thin film resistor may vary depending on the intended operating frequency range. In certain embodiments, the thickness of the thin film resistor is in a range of about 0.01 micron ($\mu$m) to about 10 $\mu$m; or in a range of about 0.1 $\mu$m to about 5 $\mu$m; or in a range of about 0.5 $\mu$m to about 1.5 $\mu$m. By placing a thin film resistor between antenna structures in a spatial power-combining device, improved isolation between antenna structures may be realized according to embodiments disclosed herein.

Figure 4A:
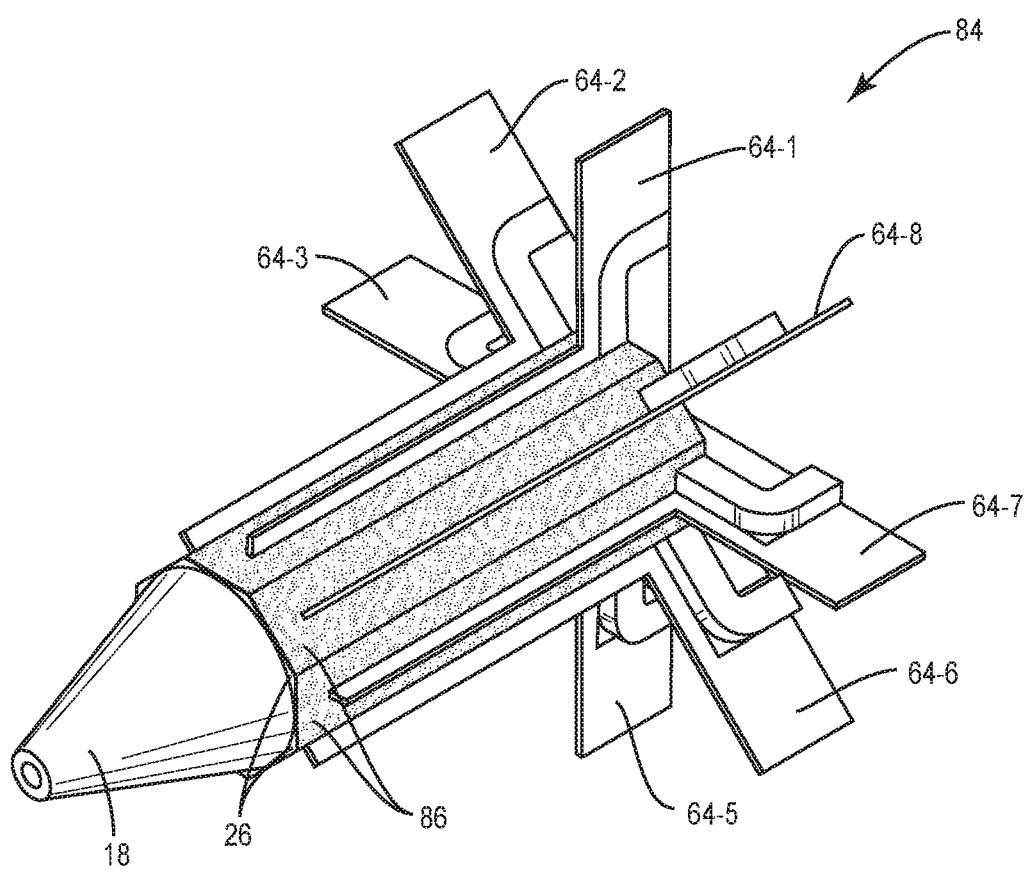
FIG. 4A is a perspective view of a model of a spatial power-combining device that is configured the same as the model of FIG. 3A and further includes one or more thin film resistors according to embodiments disclosed herein.

FIG. 4A is a perspective view of a model 84 of a spatial power-combining device that is configured the same as the model 80 of FIG. 3A and further includes one or more thin film resistors 86 according to embodiments disclosed herein. In this regard, the model 84 includes the body structures 26 of metal between and supporting the input antenna structures 64-1 to 64-8. Each input antenna structure 64-1 to 64-8 is radially arranged to receive a signal from the input coaxial waveguide section (14 of FIG. 2). For simplicity, only the input inner conductor 18 is illustrated in FIG. 4A. Additionally, only portions of the body structures 26 and the input antenna structures 64-1 to 64-8 are illustrated. In particular, the model 84 is only shown to a plane 82 that would be close to the amplifiers (66 of FIG. 2). As previously described, the performance results of the model 84 are also applicable to the output antenna structures (68 of FIG. 2) and the output coaxial waveguide section (32 of FIG. 2). In the model 84, thin film resistors 86 are arranged on a surface of each of the body structures 26. In particular, each of the thin film resistors 86 are arranged to conformally coat surfaces of the body structures 26 between the input antenna structures 64-1 to 64-8. For the model 84, the thin film resistors 86 comprise a nickel chromium film configured with a sheet resistivity of about 150 Ω/sq.

Figure 4B:
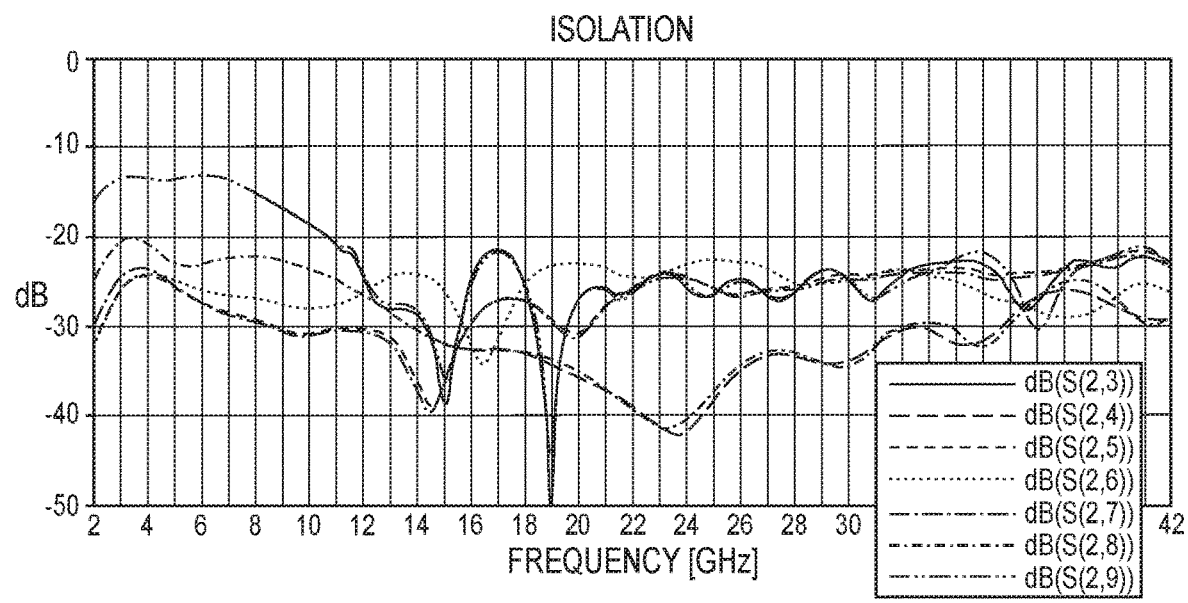
FIG. 4B is an S-parameters plot representing output isolation in dB across a frequency range for the model of FIG. 4A.

FIG. 4B is an S-parameters plot representing output isolation in dB across a frequency range for the model 84 of FIG. 4A. Values that are farther away from 0 dB indicate better output isolation than values that are closer to 0 dB. As with the plot of FIG. 3C, S(2,3) represents output isolation between the antenna structure 64-1 and the antenna structure 64-2 of FIG. 4A; S(2,4) represents output isolation between the antenna structure 64-1 and the antenna structure 64-3 of FIG. 4A; S(2,5) represents output isolation between the antenna structure 64-1 and the antenna structure 64-4 of FIG. 4A; S(2,6) represents output isolation between the antenna structure 64-1 and the antenna structure 64-5 of FIG. 4A; S(2,7) represents output isolation between the antenna structure 64-1 and the antenna structure 64-6 of FIG. 4A; S(2,8) represents output isolation between the antenna structure 64-1 and the antenna structure 64-7 of FIG. 4A; and finally S(2,9) represents output isolation between the antenna structure 64-1 and the antenna structure 64-8 of FIG. 4A. As illustrated, the output isolation is less than 20 dB for most frequencies along the frequency range, which is notably improved from the plot of FIG. 3C.

Figure 4C:
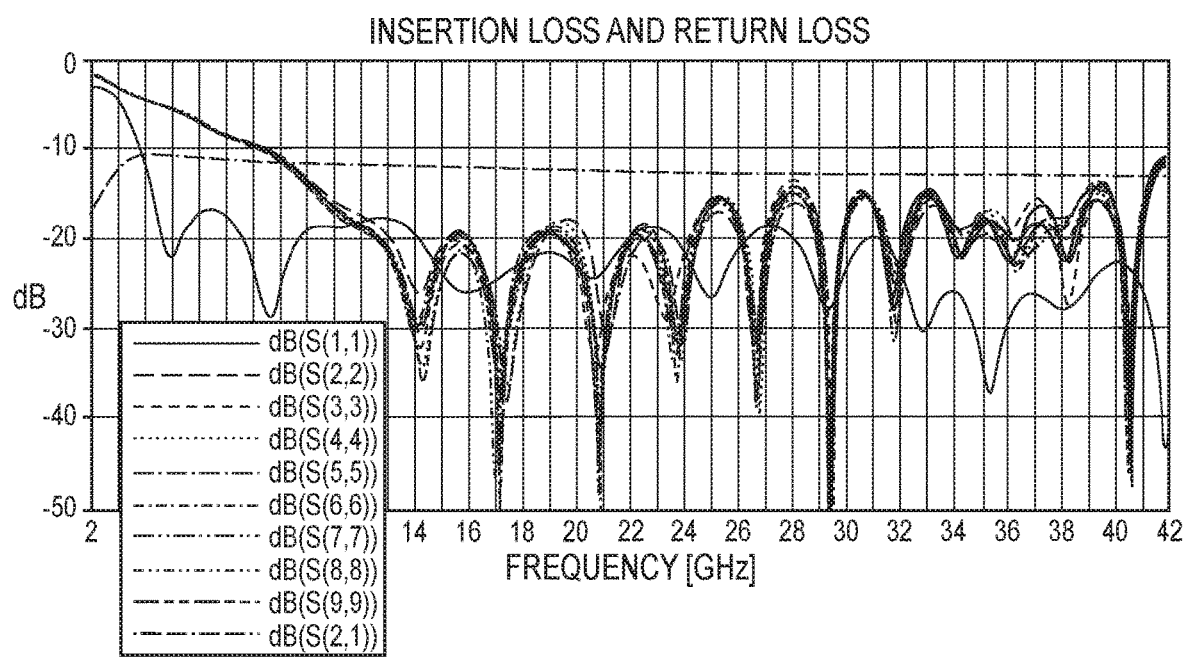
FIG. 4C is an S-parameters plot representing insertion loss and return loss in dB across the same frequency range shown in FIG. 4B for the model of FIG. 4A.

FIG. 4C is an S-parameters plot representing insertion loss and return loss in dB across the same frequency range shown in FIG. 4B for the model 84 of FIG. 4A. For return loss, values that are closer to 0 dB indicate worse return loss than values that are farther away from 0 dB. S(1,1) represents input return loss for the model 84 of FIG. 4A. As illustrated, the input return loss is close to about 20 dB for many frequencies of the frequency range plotted, indicating acceptable input return loss. S(2,2) through S(9,9) represent output return loss for each of the respective antenna structures 64-1 to 64-8 of FIG. 4A, and as illustrated, the plot lines for S(2,2) through S(9,9) can overlay one another at various frequencies. Notably, the output return loss, or S(2,2) to S(9,9), is less than 10 dB for many of the plotted frequencies and is more closely matched with the input return loss S(1,1) than the S(2,2) to S(9,9) values plotted in FIG. 3D. S(2,1) represents insertion loss of the model 84 of FIG. 4A and values below 10 dB are considered normal. As illustrated, many of the S(2,1) values slightly exceed 10 dB, which is a minor trade-off to the improved isolation and return loss provided by the thin film resistors (86 of FIG. 4A).

According to embodiments disclosed herein, thin film resistors may be arranged in spatial power-combining devices in a variety of manners to reduce electromagnetic signals from bleeding between closely spaced amplifier assemblies. In certain embodiments, a thin film resistor may be provided on a substrate that is attached to a surface of an amplifier assembly. In other embodiments, a thin film resistor may be provided on a surface of an amplifier assembly without an intermediate substrate.

Figure 5A:
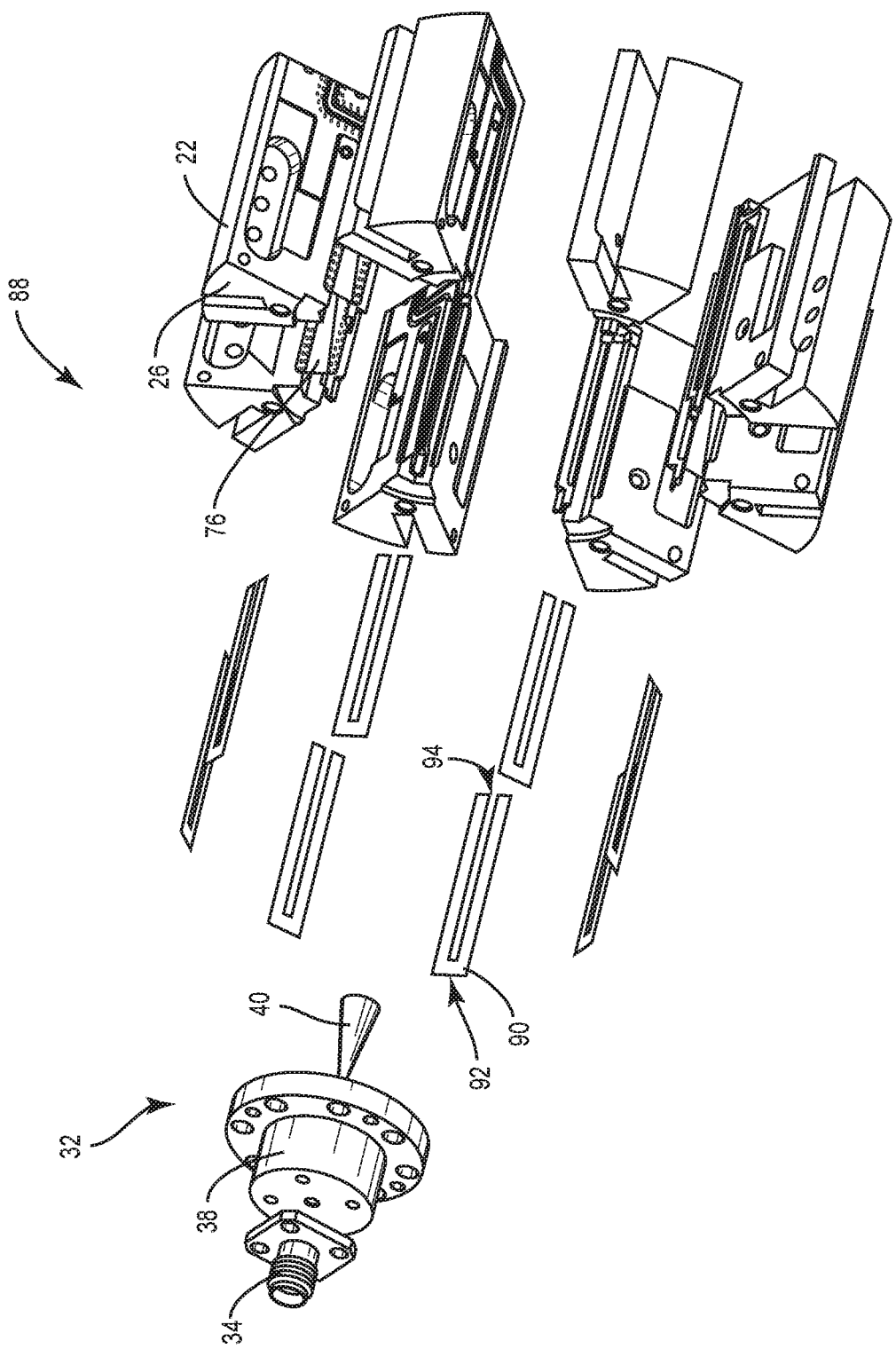
FIG. 5A is an exploded perspective view of a partial spatial power-combining device that includes a plurality of thin film resistors, each of which are arranged on a separate carrier substrate according to embodiments disclosed herein.

FIG. 5A is an exploded perspective view of a partial spatial power-combining device 88 that includes a plurality of thin film resistors 90, each of which are arranged on a separate carrier substrate 92 according to embodiments disclosed herein. The partial spatial power-combining device 88 illustrated in FIG. 5A includes the output port 34, the output coaxial waveguide section 32 with the output inner conductor 38 and the output outer conductor 40, and the plurality of amplifier assemblies 22, each of which includes the body structure 26 and the second board 76 as previously described. The amplifier assemblies 22 are only illustrated up to portions that would be adjacent to where the plurality of amplifiers (66 of FIG. 2) are located. By arranging the thin film resistor 90 on the carrier substrate 92, the thin film resistor 90 may be formed separately from the spatial power-combining device 88 and may be subsequently attached to the spatial power-combining device 88. This allows the ability to tune or tailor the performance of the spatial power-combining device 88 by either preselecting the particular thin film resistor 90 that provides a desired amount of sheet resistance or by adding or changing the thin film resistor 90 based on a performance characteristic of the spatial power-combining device 88. In certain embodiments, the thin film resistor 90 may be formed on a single surface of the carrier substrate 92. In other embodiments, the thin film resistor 90 may be formed on multiple surfaces of the carrier substrate 92, such as opposing major faces of the carrier substrate 92, or on all major faces and sidewalls of the carrier substrate 92 to substantially enclose all exterior surfaces of the carrier substrate 92. The thin film resistor 90 may be formed by a deposition technique, such as sputtering, chemical vapor deposition, or plasma assisted chemical vapor deposition. Another advantage of forming the thin film resistor 90 on the carrier substrate 92 separately from the spatial power-combining device 88 is the shape of the thin film resistor 90 may be predetermined by the shape of the carrier substrate 92. In this regard, each thin film resistor 90 may form a shape with one or more alignment features 94 that are configured to provide improved placement within each amplifier assembly 22 of the spatial power-combining device 88. In FIG. 5A, each of the thin film resistors 90 and carrier substrates 92 form an alignment feature 94 that is an opening or slot. The alignment feature 94 is configured to be attached to a particular amplifier assembly 22 such that the thin film resistor 90 is arranged on opposing faces of the second board 76. As previously described, the second board 76 includes the output antenna structure (68 of FIG. 2). Accordingly, each thin film resistor 90 may be arranged on opposing faces of a separate output antenna structure (68 of FIG. 2) to provide improved isolation. When assembled, the plurality of thin film resistors 90 are thereby radially arranged within the plurality of amplifier assemblies 22 proximate the radial location of the output antenna structures (68 of FIG. 2). In certain embodiments, one or more thin film resistors 90 may be arranged within the plurality of amplifier assemblies 22 proximate the radial location of the input antenna structures (64 of FIG. 2).

Figure 5B:
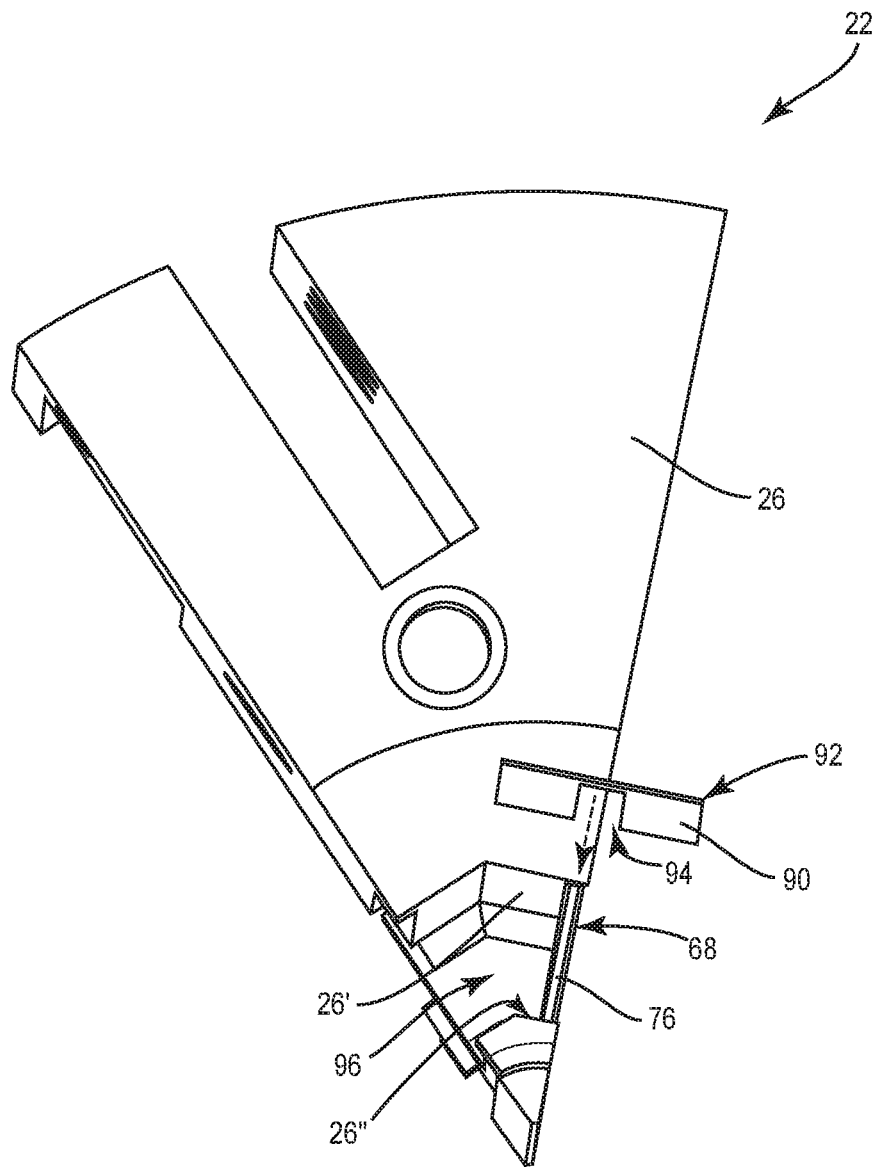
FIG. 5B is an end view illustrating the placement of an individual thin film resistor within an individual amplifier assembly of FIG. 5A.

FIG. 5B is an end view illustrating the placement of an individual thin film resistor 90 within an individual amplifier assembly 22 of FIG. 5A. The body structure 26 of the amplifier assembly 22 includes a first interior surface 26' and a second interior surface 26" that form an opening 96 therebetween. When radially arranged in a fully assembled spatial power-combining device, the second interior surface 26" is arranged closer to the center axis (24 of FIG. 1) of the spatial power-combining device. The output antenna structure 68 including the second board 76 is arranged across the opening 96. The thin film resistor 90 on the carrier substrate 92 is illustrated in exploded view. As shown, the alignment feature 94 is configured in a manner such that the thin film resistor 90 may slide or be otherwise arranged into the amplifier assembly 22 in a direction indicated by the dashed arrow. Accordingly, the second board 76 is thereby received within the alignment feature 94 and the thin film resistor 90 is arranged on and extending away from opposing faces of the second board 76. In this manner, a portion of the thin film resistor 90 is arranged on a portion of the first interior surface 26' that is proximate the second board 76 and another portion of the thin film resistor 90 protrudes away from the amplifier assembly 22. When fully assembled with a radially arranged plurality of amplifier assemblies 22 as shown in FIG. 5A, the protruding portion of the thin film resistor 90 may be arranged on a portion of the first interior surface 26' of an adjacent amplifier assembly 22. In this regard, the thin film resistor 90 is arranged on the interior surfaces 26' of both a first and second amplifier assembly 22.

Figure 6A:
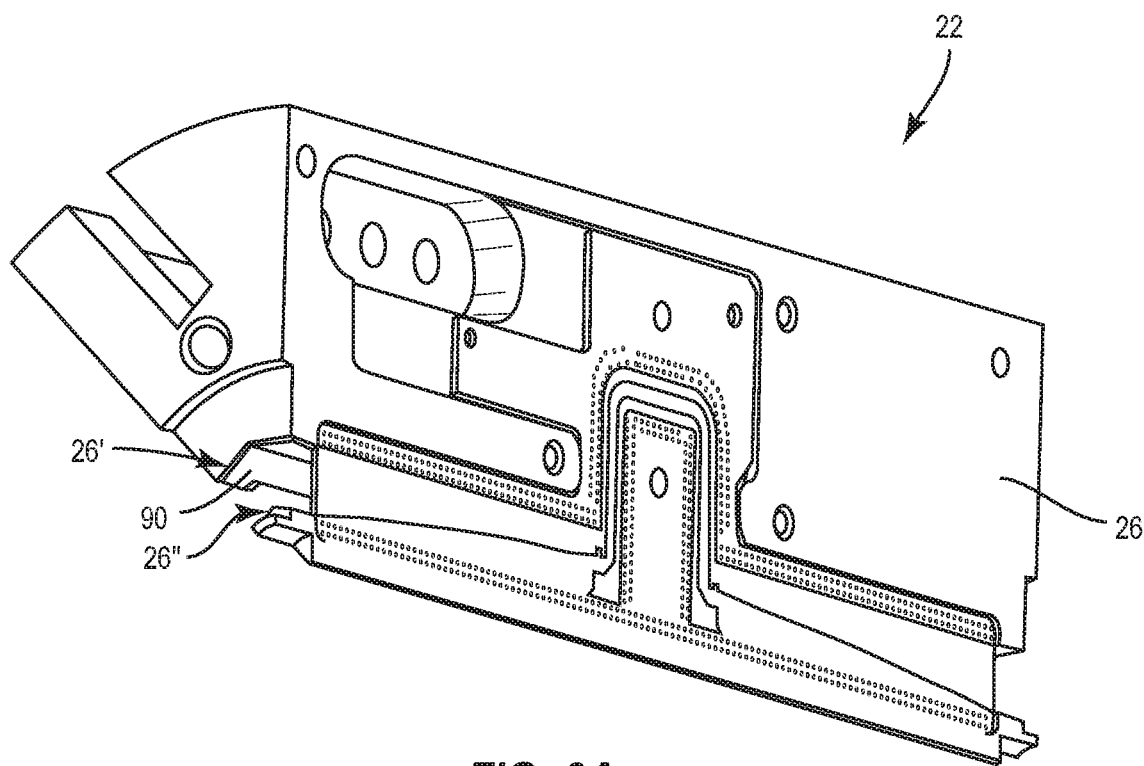
FIG. 6A is a perspective front view of a representative amplifier assembly where a thin film resistor is formed within the amplifier assembly without the carrier substrate of FIG. 5A.
Figure 6B:
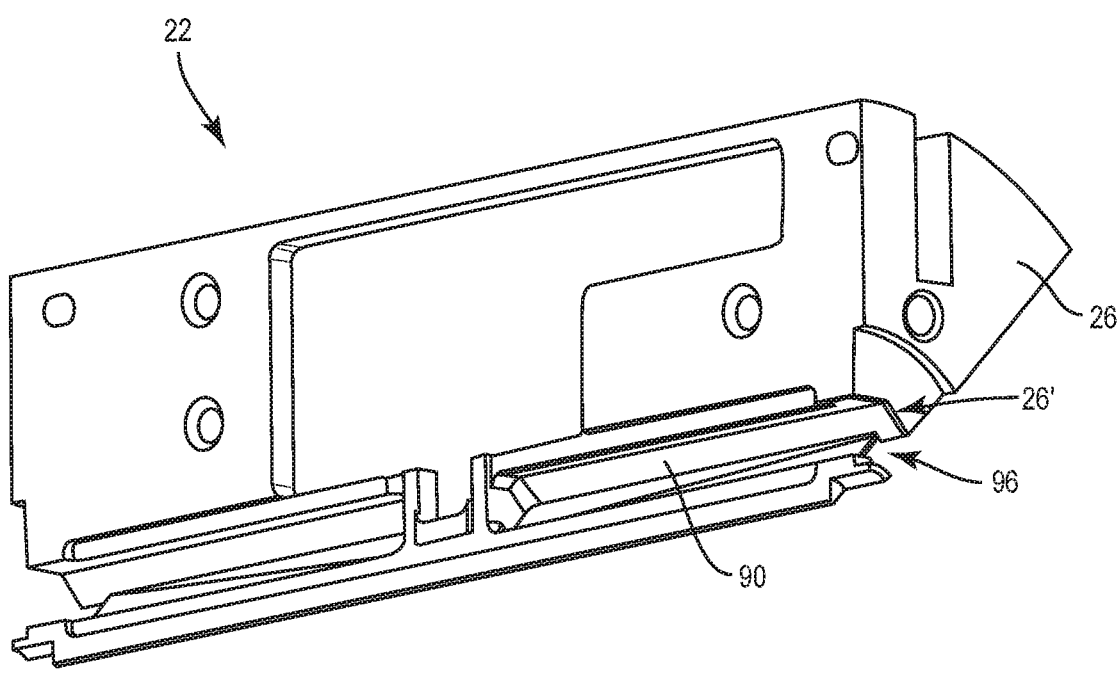
FIG. 6B is a perspective back view of the body structure of the amplifier assembly of FIG. 6A.

FIG. 6A is a perspective front view of a representative amplifier assembly 22 where the thin film resistor 90 is formed within the amplifier assembly 22 without the carrier substrate 92 of FIG. 5A. As illustrated, the thin film resistor 90 may be formed or deposited on the first interior surface 26'. In this manner, the thin film resistor 90 may be formed to conformally coat the first interior surface 26'. In certain embodiments, the thin film resistor 90 may be formed on the entire first interior surface 26'. In certain embodiments, the thin film resistor 90 may be formed on the second interior surface 26" in addition to or in place of the first interior surface 26'. FIG. 6B is a perspective back view of the body structure 26 of the amplifier assembly 22 of FIG. 6A. As illustrated, the thin film resistor 90 may be arranged on the first interior surface 26' across a lengthwise majority of the opening 96. When fully assembled with a radially arranged plurality of amplifier assemblies 22 as shown in FIG. 5A, each thin film resistor 90 may thereby be fully arranged within a different amplifier assembly 22 to provide improved isolation.

Those skilled in the art will recognize improvements and modifications to the preferred embodiments of the present disclosure. All such improvements and modifications are considered within the scope of the concepts disclosed herein and the claims that follow.

What is claimed is:

1. A spatial power-combining device comprising a plurality of amplifier assemblies, wherein each amplifier assembly of the plurality of amplifier assemblies comprises:
   a body structure;
   an amplifier arranged on the body structure;
   an output antenna structure arranged on the body structure and configured to receive an amplified signal from the amplifier; and
   a thin film resistor on at least one surface of the body structure that is configured to provide isolation between the output antenna structures of each amplifier assembly of the plurality of amplifier assemblies.

2. The spatial power-combining device of claim 1, wherein the thin film resistor comprises nickel chromium, tantalum nitride, or silicon chromium.

3. The spatial power-combining device of claim 1, wherein the thin film resistor comprises a thickness in a range from about 0.01 micron (μm) to about 10 μm.

4. The spatial power-combining device of claim 1, wherein the thin film resistor comprises a thickness in a range from about 0.5 micron (μm) to about 1.5 μm.

5. The spatial power-combining device of claim 1, wherein the thin film resistor is configured on a carrier substrate.

6. The spatial power-combining device of claim 5, wherein the carrier substrate comprises a ceramic substrate.

7. The spatial power-combining device of claim 5, wherein the carrier substrate comprises alumina, copper foil, silicon, or gallium arsenide.

8. The spatial power-combining device of claim 5, wherein the thin film resistor and the carrier substrate form an alignment feature configured for placement within a particular amplifier assembly of the plurality of amplifier assemblies.

9. The spatial power-combining device of claim 8, wherein the alignment feature is configured to receive a board of the output antenna structure such that the thin film resistor is arranged on opposing faces of the board.

10. The spatial power-combining device of claim 1, wherein the at least one surface is a first interior surface of the body structure, the first interior surface and a second interior surface form an opening therebetween.

11. The spatial power-combining device of claim 10, wherein the second interior surface is arranged closer to a center axis of the spatial power-combining device.

12. The spatial power-combining device of claim 1, wherein the thin film resistor is on both of a first interior surface of a first amplifier assembly of the plurality of amplifier assemblies and a first interior surface of a second amplifier assembly of the plurality of amplifier assemblies.

13. The spatial power-combining device of claim 1, wherein the amplifier comprises a monolithic microwave integrated circuit (MMIC) amplifier.

14. A spatial power-combining device comprising a plurality of amplifier assemblies, wherein each amplifier assembly of the plurality of amplifier assemblies comprises:
   an amplifier arranged on a body structure, the body structure comprising a first interior surface and a second interior surface that form an opening therebetween;
   an antenna structure on the body structure, the antenna structure arranged across the opening; and
   a thin film resistor on the first interior surface.

15. The spatial power-combining device of claim 14, wherein the thin film resistor comprises nickel chromium, tantalum nitride, or silicon chromium.

16. The spatial power-combining device of claim 14, wherein the thin film resistor comprises a thickness in a range from about 0.01 micron (μm) to about 10 μm.

17. The spatial power-combining device of claim 14, wherein the thin film resistor comprises a thickness in a range from about 0.5 micron (μm) to about 1.5 μm.

18. The spatial power-combining device of claim 14, wherein the thin film resistor is directly on the first interior surface.

19. The spatial power-combining device of claim 14, wherein the thin film resistor is on a carrier substrate that is arranged on the first interior surface.

20. The spatial power-combining device of claim 19, wherein the carrier substrate comprises alumina, copper foil, silicon, or gallium arsenide.

21. The spatial power-combining device of claim 14, wherein the antenna structure is electrically grounded to the body structure.

22. The spatial power-combining device of claim 14, wherein the antenna structure is an output antenna structure that is configured to receive an amplified signal from the amplifier.

23. The spatial power-combining device of claim 14, wherein the amplifier comprises a monolithic microwave integrated circuit (MMIC) amplifier.

\* \* \* \* \*